(12) United States Patent
Schurr et al.

(10) Patent No.: US 7,073,971 B2
(45) Date of Patent: Jul. 11, 2006

(54) APPARATUS AND METHODS FOR DETACHABLY MOUNTING DEVICES TO RAILS

(75) Inventors: Larry Edward Schurr, Elgin, IL (US); Jay John Bolante, Chicago, IL (US); John Harty Brandenburg, Skokie, IL (US); Dale Charles Corel, Elk Grove, IL (US); Carlos Delgado, Chicago, IL (US); Jamie Kim, Northbrook, IL (US); Maureen Patricia White, Chicago, IL (US)

(73) Assignee: EGS Electrical Group, LLC, Rosemont, IL (US)

( * ) Notice: Subject to any disclaimer, the term of this patent is extended or adjusted under 35 U.S.C. 154(b) by 151 days.

(21) Appl. No.: 10/775,727

(22) Filed: Feb. 10, 2004

(65) Prior Publication Data

US 2005/0175402 A1     Aug. 11, 2005

(51) Int. Cl.
*H01R 13/66* (2006.01)

(52) U.S. Cl. .................. 403/325; 403/327; 403/374.5; 439/94; 439/532

(58) Field of Classification Search ................ 403/325, 403/327, 331, 363, 374.5, 375; 439/94, 532, 439/716; 248/222.13, 227.2
See application file for complete search history.

(56) References Cited

U.S. PATENT DOCUMENTS

| | | |
|---|---|---|
| D281,315 S | 11/1985 | Kjeld |
| D284,959 S | 8/1986 | Berg |
| 4,931,898 A | 6/1990 | Cole |
| 5,103,373 A | 4/1992 | Rusch et al. |
| D358,369 S | 5/1995 | Shimizu et al. |
| 5,480,310 A * | 1/1996 | Baum .......................... 439/94 |
| 5,483,229 A | 1/1996 | Tamura et al. |
| D376,329 S | 12/1996 | Youabian |
| D376,350 S | 12/1996 | Worley et al. |
| D394,642 S | 5/1998 | Bender |
| D400,513 S | 11/1998 | Seirio |
| D402,275 S | 12/1998 | Korhonen |

(Continued)

FOREIGN PATENT DOCUMENTS

DE    196 46 696 C 1     11/1996

(Continued)

OTHER PUBLICATIONS

One page advertisement titled "We've always made getting the right Power Supply Easy. Now it's a SNAP"; Feb. 1998, edition of *The Electrical Distirbutor*.

*Primary Examiner*—Daniel P. Stodola
*Assistant Examiner*—Michael P. Ferguson
(74) *Attorney, Agent, or Firm*—Harness, Dickey & Pierce, P.L.C.

(57) ABSTRACT

An apparatus for detachably mounting a device to a rail. The rail has generally oppositely facing first and second edges, each having adjacent front and back faces. The apparatus includes a bracket on the device. The bracket has a recess for receiving the first edge of the rail. The recess includes a lip for engaging the back face of the rail adjacent the first edge. The apparatus also includes a clamp on the device. The clamp has a resilient wing for resiliently engaging the front face of the rail, proximal to the engagement between the rail and the lip. The apparatus further includes a latch for engaging the back face of the rail adjacent the second edge against the bias of the clamp.

26 Claims, 9 Drawing Sheets

U.S. PATENT DOCUMENTS

| | | |
|---|---|---|
| D408,796 S | 4/1999 | Georgopulos |
| D408,823 S | 4/1999 | Kirby |
| 5,890,916 A * | 4/1999 | Diekmann et al. ............ 439/94 |
| 5,904,592 A | 5/1999 | Baran et al. |
| D424,529 S | 5/2000 | Raspotnig |
| 6,172,875 B1 | 1/2001 | Suzuki et al. |
| D442,923 S | 5/2001 | Raspotnig |
| 6,292,076 B1 | 9/2001 | DeGrazia et al. |
| 6,418,027 B1 | 7/2002 | Suzuki et al. |
| 6,431,909 B1 | 8/2002 | Nolden et al. |
| 6,471,552 B1 * | 10/2002 | Bechaz et al. .............. 439/716 |
| 6,543,957 B1 | 4/2003 | Raspotnig |

FOREIGN PATENT DOCUMENTS

| | | |
|---|---|---|
| DE | 201 08 417 U 1 | 5/2001 |
| EP | 1 189 320 A 2 | 3/2002 |

* cited by examiner

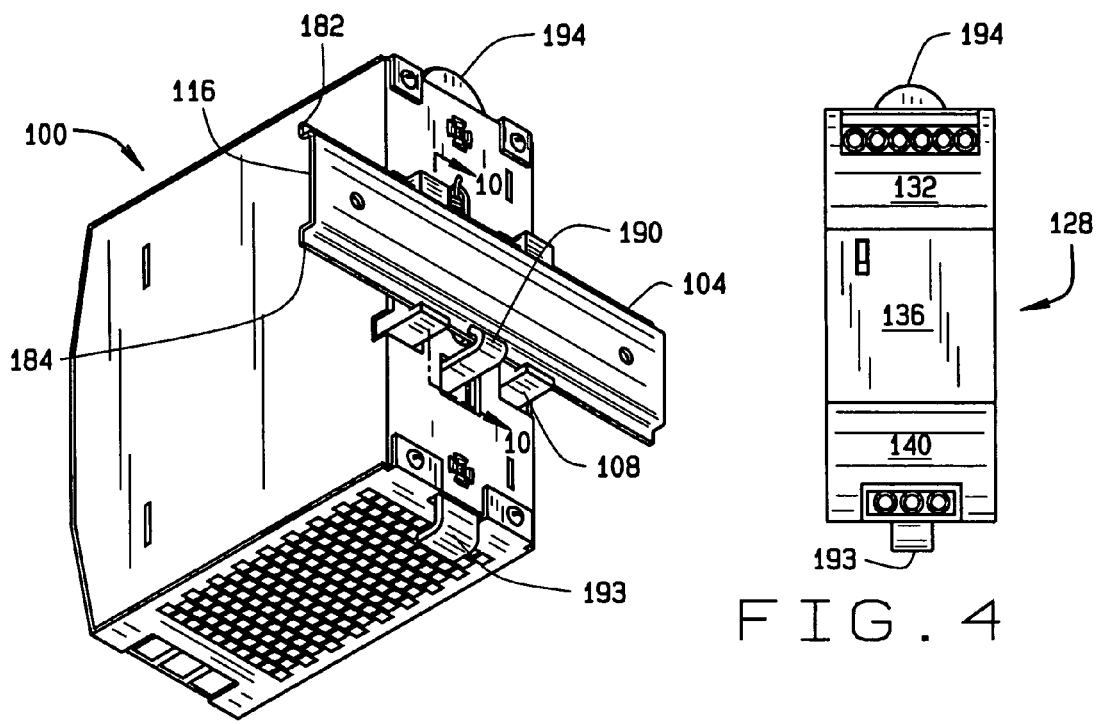
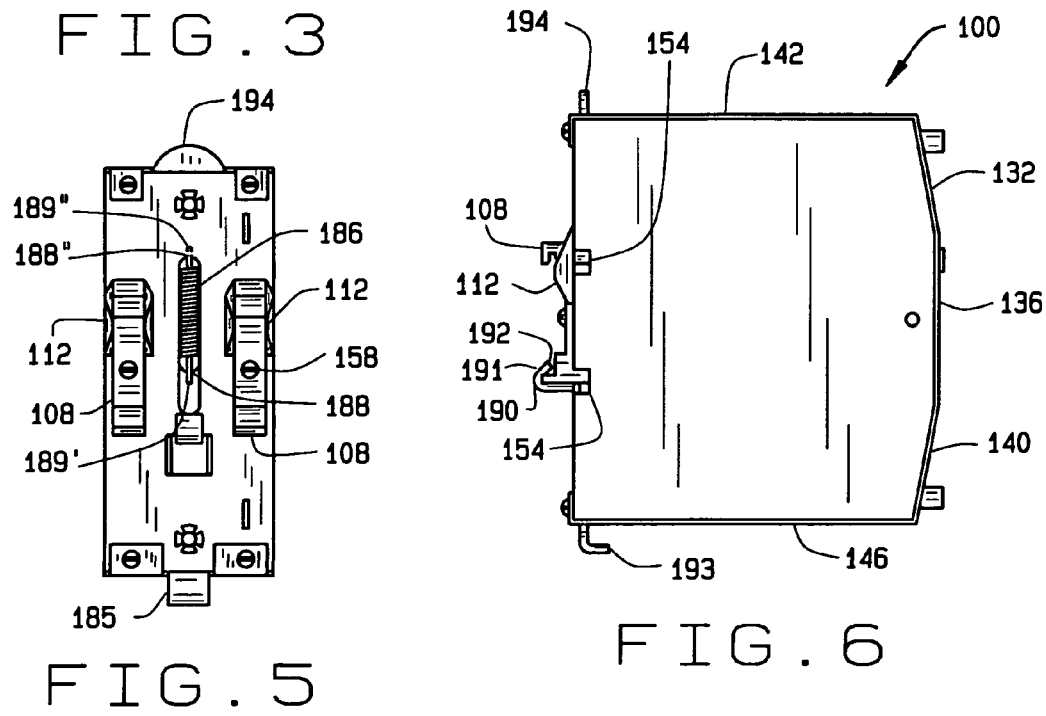

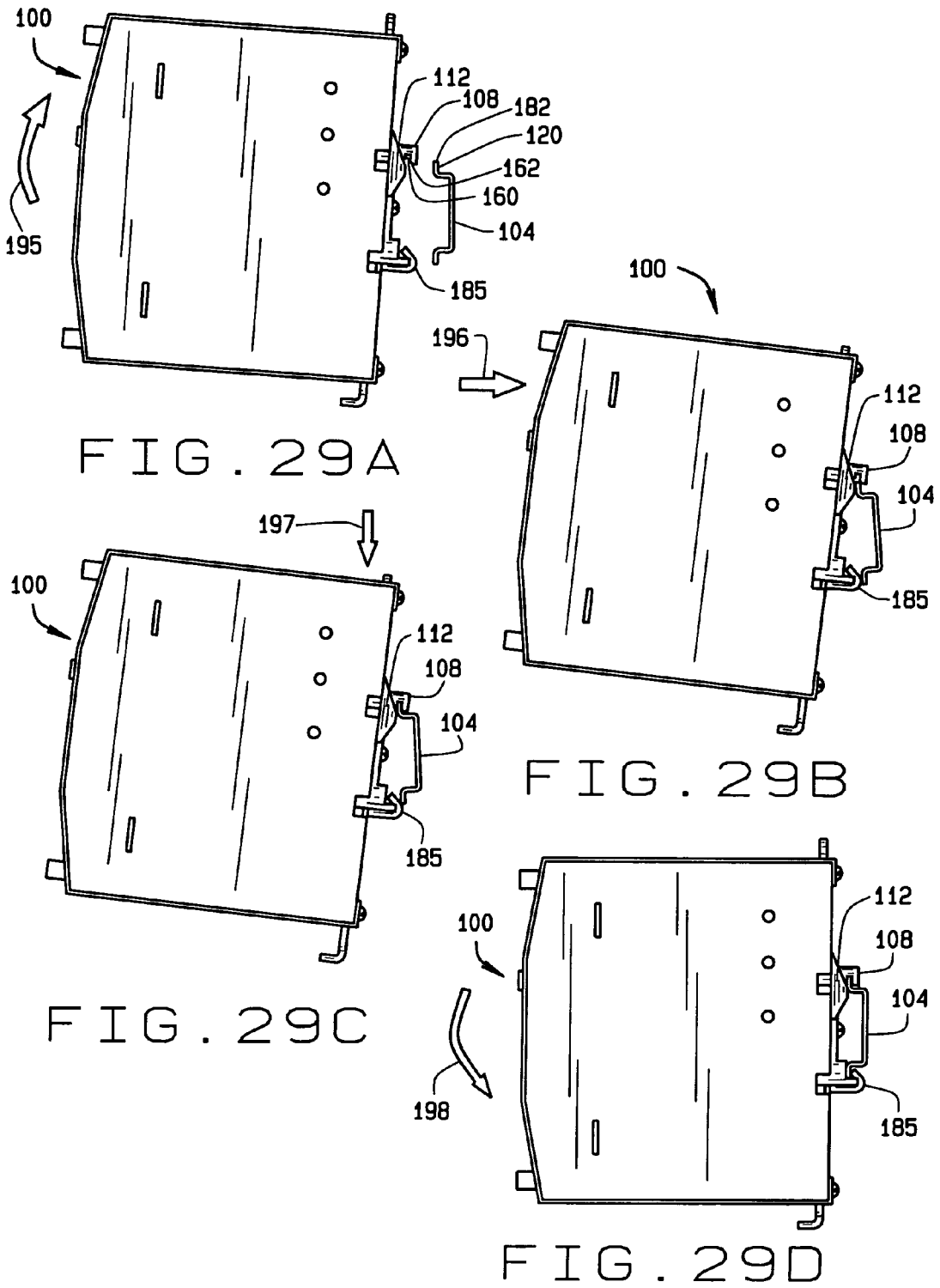

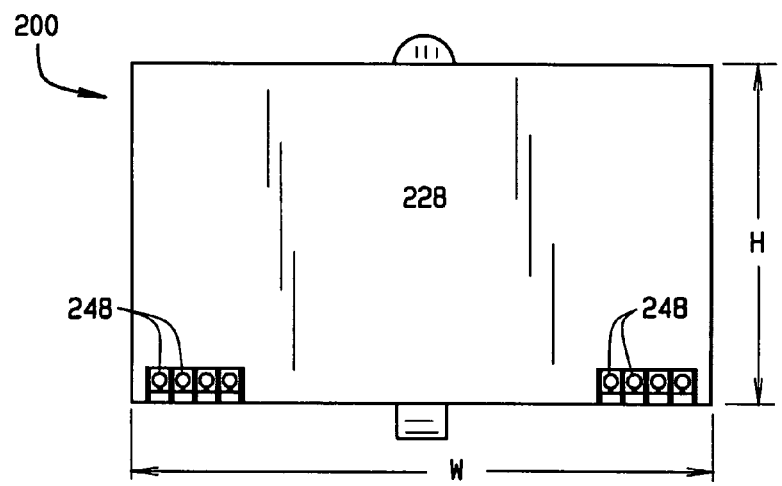
FIG. 30
FIG. 31
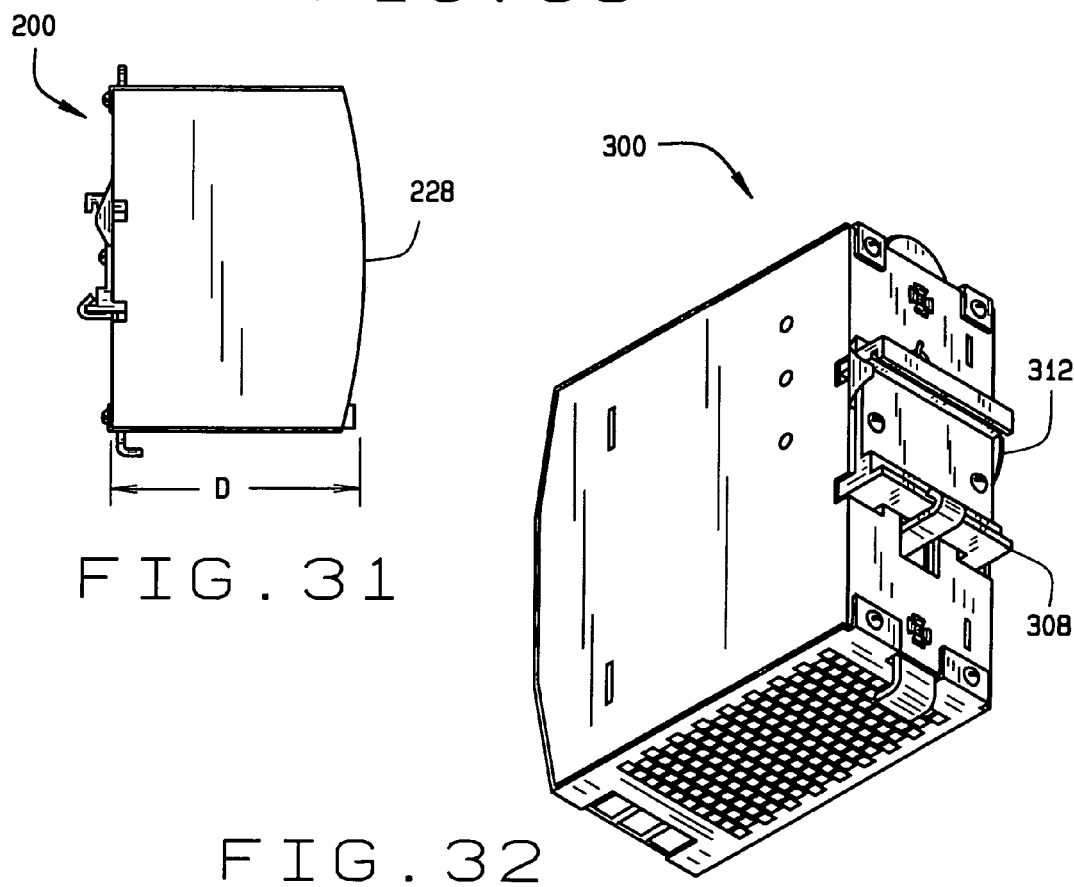
FIG. 32

APPARATUS AND METHODS FOR DETACHABLY MOUNTING DEVICES TO RAILS

FIELD

The present invention relates generally to the rail mounted devices, and more particularly (but not exclusively) to apparatus and methods for detachably mounting devices to rails.

BACKGROUND

Electrical component housings are frequently mounted to a DIN rail, which, in turn, can be formed on or mounted to a panel using with screws or other suitable fasteners. Indeed, power supplies must often be detachably mounted to a DIN rail in a manner which resists unintentional loosening or detachment of the housing from the rail but which permits easy removal for repair or replacement.

Although standardized DIN rails are typically used for mounting electrical components, such is not always the case. Instead, different, non-standard rail types are becoming more widespread in use. Such rails can differ with regard to the thickness of the material used to form the rail and/or width of the side flanges. Because of these differences, it is not always possible to securely mount an electrical component to one of these different rails with existing methods and devices.

SUMMARY

A preferred embodiment includes an apparatus for detachably mounting a device to a rail having generally oppositely facing first and second edges, each having adjacent front and back faces. The apparatus includes a bracket on the device. The bracket has a recess for receiving the first edge of the rail. The recess includes a lip for engaging the back face of the rail adjacent the first edge. The apparatus also includes a clamp on the device. The clamp has a resilient wing for resiliently engaging the front face of the rail, proximal to the engagement between the rail and the lip. The apparatus further includes a latch for engaging the back face of the rail adjacent the second edge against the bias of the clamp.

Further areas of applicability of the present invention will become apparent from the detailed description provided hereinafter. It should be understood that the detailed description and specific examples below, while indicating exemplary embodiments of the invention, are intended for purposes of illustration only and are not intended to limit the scope of the invention.

BRIEF DESCRIPTION OF THE DRAWINGS

The present invention will be more fully understood from the detailed description and the accompanying drawings, wherein:

FIG. 3 is a perspective view of the housing shown in FIG. 1 shown while mounted to a rail;

FIG. 4 is a front elevation view of the housing shown in FIG. 1;

FIG. 5 is a rear elevation view of the housing shown in FIG. 1;

FIG. 6 is a left side elevation view of the housing shown in FIG. 1;

FIGS. 29A through 29D illustrate various stages of the housing in FIG. 7 being detachably mounted to a rail;

FIG. 30 is a front elevation view of a housing according to another preferred embodiment of the invention;

FIG. 31 is a left side elevation view of the housing in FIG. 30;

FIG. 32 is a rear perspective view of a housing according to another preferred embodiment of the invention.

Corresponding reference numerals indicate corresponding parts throughout the several views of the drawings.

DETAILED DESCRIPTION OF EXEMPLARY EMBODIMENTS

Figure 1:
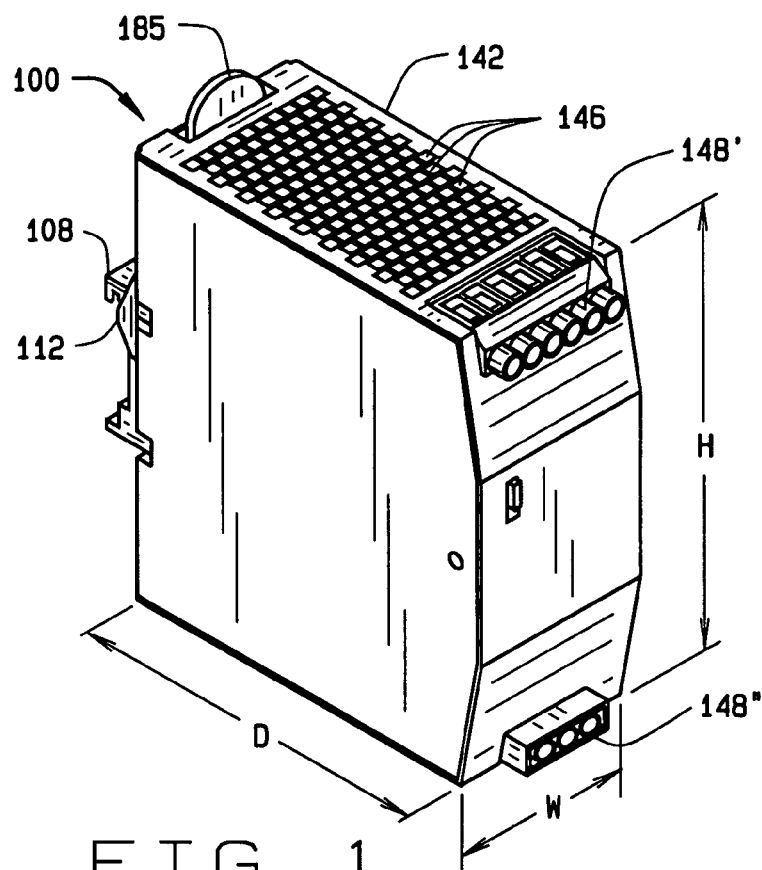
FIG. 1 is a front perspective view of a housing according to a preferred embodiment of the invention.

The following description of the preferred embodiments is merely exemplary in nature and is in no way intended to limit the invention, its application, or uses.

According to one aspect, the invention provides apparatus for detachably mounting a device to a rail having generally oppositely facing first and second edges, each having adjacent front and back faces. In an exemplary embodiment, an apparatus includes a bracket on the device. The bracket has a recess for receiving the first edge of the rail. The recess includes a lip for engaging the back face of the rail adjacent the first edge. The apparatus also includes a clamp on the device. The clamp has a resilient wing for resiliently engaging the front face of the rail, proximal to the engagement between the rail and the lip. The apparatus further includes a latch for engaging the back face of the rail adjacent the second edge against the bias of the clamp.

The resilient engagement of the wing with the front face of the rail can flex, deflect and/or deform the wing such that a clamping force is applied generally between the bracket and the rail. This clamping force can accommodate for varying dimensions and structures of different types of rails, and can at least inhibit sliding of the bracket along a rail even when the rail is not a standardized DIN rail.

According to another aspect, the invention provides a housing which can include at least one of such apparatus for detachably mounting the housing to a rail. As described below, the housing can also include a beveled or chamfered front surface (a break front), and one or more openings for venting an area between the housing and a component (e.g., electrical power supply, etc.) within the housing. According to yet another aspect, the invention provides power supplies and electrical components within such housings.

FIGS. 1 through 9 illustrate an exemplary housing or chassis 100 in accordance with the principles of this invention. The housing 100 is preferably sized to receive an electrical component, such as an electrical power supply or other component. As shown, the housing 100 can be detachably mountable to a rail, such as a DIN rail 104 (FIGS. 3 and 29), among other rail types. The DIN rail 104 defines an elongate channel 116 having two generally opposed parallel outwardly extending edges or flanges 182 and 184. The rail 104 can be horizontally mounted to an electrical panel (not shown) such that the first and second edges 182 and 184 comprise upper and lower edges, respectively. Alternatively, the rail can be vertically mounted to an electrical panel (not shown) such that the first and second edges and comprise right and left side edges, respectively.

At least one bracket 108 and at least one clamp 112 are used to detachably mount the housing 100 to the rail 104, as shown in FIGS. 3 and 29. The brackets 108 and clamps 112 are coupled to the housing 100 in an exemplary manner described below. Although FIGS. 1 through 9 show the housing 100 with two brackets 108 and two clamps 112, other embodiments of the housing can include any suitable number of (i.e., one or more) brackets 108 and clamps 112 depending on the particular application. For example, FIG. 32 illustrates an exemplary housing 300 to which is coupled a single bracket 308 and a single clamp 312. Or for example, another exemplary housing can include three brackets and three clamps.

With further reference to FIGS. 1 through 9, the housing 100 includes a chamfered or beveled front surface 128. This break front 128 is preferably formed by three generally flat panels 132, 136, 140 with the middle panel 136 being sized to allow the housing 100 to be placed upon and supported by a generally horizontal surface in a relatively stable manner such that the housing 100 will not easily wobble or tip over.

Alternatively, other embodiments can include a housing having a beveled surface formed of more than three flat surfaces. In yet other embodiments, the front surface of the housing need not be beveled. Instead, the housing front surface can be formed of a single generally flat surface. Still yet other embodiments can include a housing having a generally rounded front surface, such as the housing 200 as shown in FIG. 31.

To indicate an operating condition of the component within the housing 100, one or more lights (e.g., LEDs, etc.) or other indicators can be provided on the front surface 128. By way of example only, red blinking LEDs on the front surface 128 can be used to warn of short circuits and/or overload conditions.

The housing 100 can define a plurality of ventilation holes or openings for venting an area between the housing 100 and the component (e.g., electrical power supply, etc.) within the housing 100. For example, the housing 100 can include one or more suitably sized openings to permit sufficient air circulation for maintaining a suitable operating temperature within the housing 100.

Figure 9:
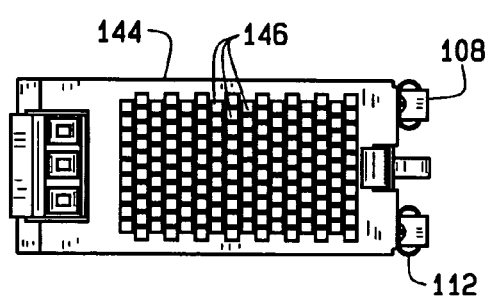
FIG. 9 is a bottom plan view of the housing shown in FIG. 1.

In the illustrated embodiment, the housing 100 includes an upper surface 142 (FIG. 8) and a lower surface 144 (FIG. 9). Each surface 142 and 144 defines a plurality of generally rectangular openings 146 arranged in rows. Each row can be generally perpendicular to the front surface 128 of the housing 100. The ventilation holes 146 can be sized in accordance with industrial standards (e.g., industrial IP20 standards, etc.) such that the openings 146 are large enough to allow adequate ventilation while also being small enough to prevent fingers and loose objects from entering the housing 100 via the holes 146.

Alternatively, other embodiments can include ventilation openings in various other geometric shapes (e.g., circular, semicircular, triangular, diamond, etc.) and other arrangements (e.g., zigzags, etc.). In addition, the size and shape of each opening can also vary, and each opening need not be the same size and/or shape as the other openings. The number, shape, size and arrangement of ventilation openings for a particular housing embodiment can depend at least in part on the amount of heat produced by the component within the housing and the preferred operating temperatures for the component.

With further reference to FIG. 1, the housing 100 can further include one or more terminals 148 for connecting an electrical component within the housing 100 to a device external to the housing 100. As shown, the housing 100 includes six upper terminals 148' and three lower terminals 148". The upper terminals 148' are direct current (DC) screw terminals, and the lower terminals 148" are alternative current (AC) screw terminals. Alternatively, the upper terminals can be alternative current (AC) screw terminals, and the lower terminals can be direct current (DC) screw terminals. In either case, separating the AC and DC terminals can reduce mistakes, noise, and heat issues. In addition, proper labeling of the screw terminals allow connections to be made in a relatively quick and error free manner.

Alternatively, other embodiments of the housing can include any suitable number of terminals in various other arrangements, with the number and arrangement depending at least in part on the component within the housing. For example, FIGS. 30 and 31 illustrate a housing 200 which includes terminals 248 located only along a lower portion of the front panel 228.

The various housings 100, 200, 300 can be provided in any suitable size depending at least in part on the particular component to be positioned within the housing, and the particular space available in which the housing is to be mounted to a rail. For purposes of illustration only, exemplary dimensions for nine different housing sizes are set forth below.

| DIMENSIONS - inches (millimeters) | | | |
|---|---|---|---|
| SIZE | HEIGHT (H) | WIDTH (W) | DEPTH (D) |
| 1 | 4.88 (124) | 1.97 (50) | 4.55 (116) |
| 2 | 4.88 (124) | 2.56 (65) | 4.55 (116) |
| 3 | 4.88 (124) | 2.91 (74) | 4.55 (116) |
| 4 | 4.88 (124) | 3.26 (83) | 4.55 (116) |
| 5 | 4.88 (124) | 3.50 (89) | 4.55 (116) |
| 6 | 4.88 (124) | 5.90 (150) | 4.55 (116) |
| 7 | 4.88 (124) | 6.88 (175) | 4.55 (116) |
| 8 | 4.88 (124) | 9.72 (247) | 4.55 (116) |
| 9 | 4.88 (124) | 11.1 (282) | 4.55 (116) |

In a preferred embodiment, the bracket 108 comprises the means for defining a recess for receiving the upper edge 182 of the rail 104. Alternatively, other means for defining a recess for receiving the upper rail edge 182 can be employed, such as bracket 308, bracket 408, other brackets and holders, etc.

Figure 12:
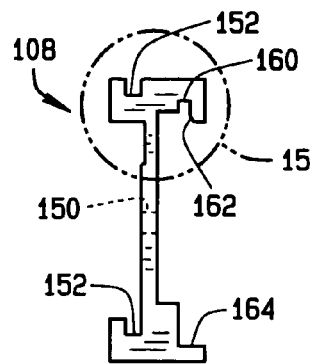
FIG. 12 is a left side elevation view of the bracket shown in FIG. 11.
Figure 13:
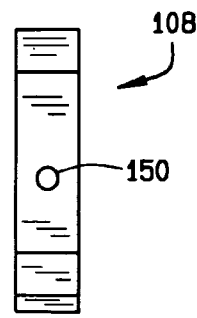
FIG. 13 is a front side elevation view of the bracket shown in FIG. 11.
Figure 14:
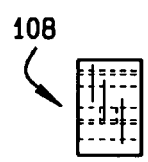
FIG. 14 is a bottom plan view of the bracket shown in FIG. 11.
Figure 15:
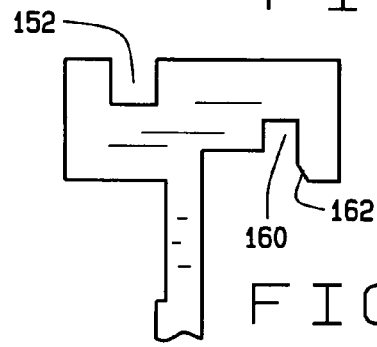
FIG. 15 is an enlarged partial side elevation view of the portion designated 15 in FIG. 12.
Figure 16:
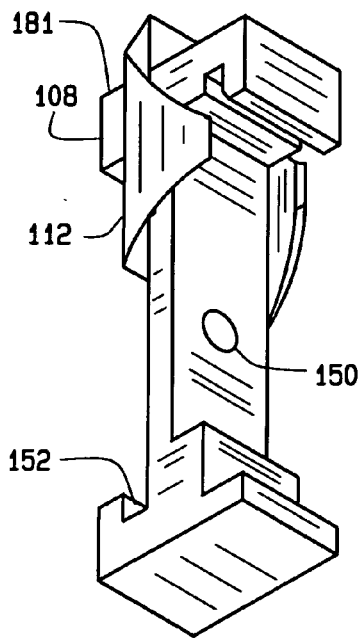
FIG. 16 is a perspective view of a bracket and clamp according to a preferred embodiment of the invention.
Figure 17:
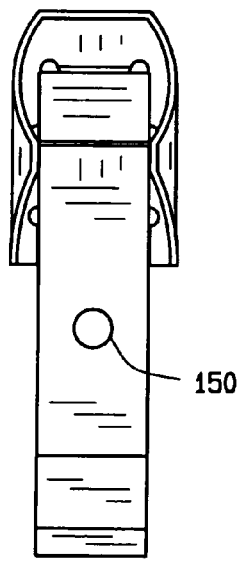
FIG. 17 is a front elevation view of the bracket and clamp shown in FIG. 16.
Figure 18:
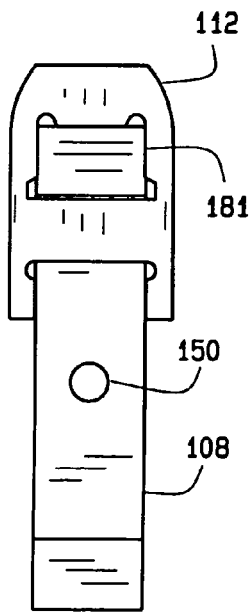
FIG. 18 is a rear elevation view of the bracket and clamp shown in FIG. 16.
Figure 19:
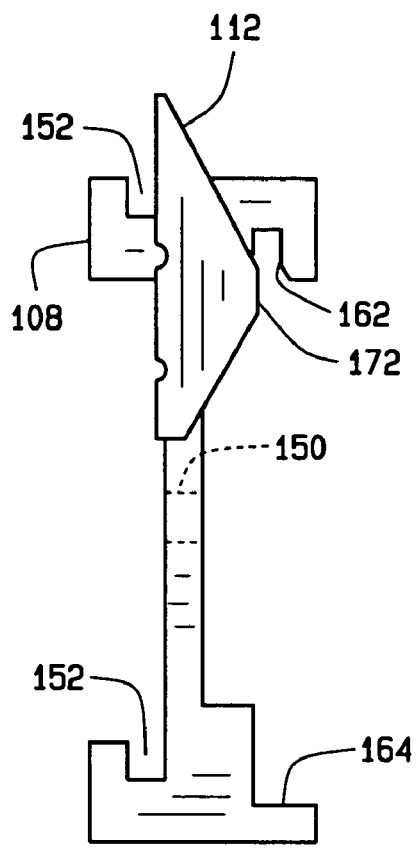
FIG. 19 is a left side elevation view of the bracket and clamp shown in FIG. 16.
Figure 20:
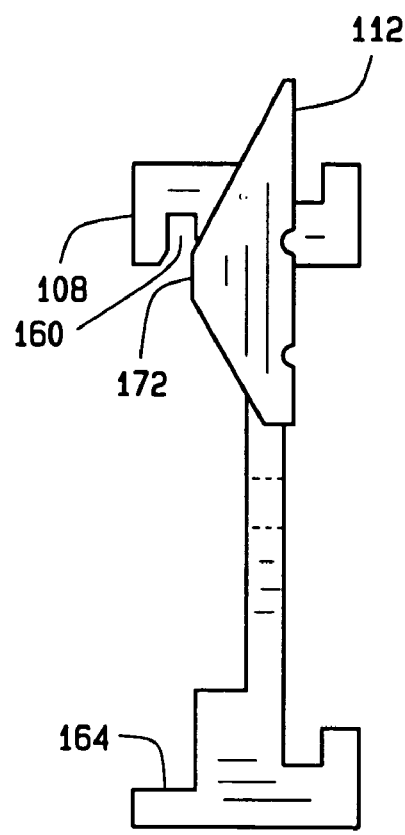
FIG. 20 is a right side elevation view of the bracket and clamp shown in FIG. 16.

The bracket 108 will now be described in further detail. As shown in FIG. 12, the bracket 108 includes a generally uniform profile, except for the fastener hole 150. Accordingly, the bracket 108 can be produced in a relatively inexpensive manner. For example, the bracket 108 can be formed by machining metal or by extrusion to form the bracket 108 and then drilling the fastener hole 150 therethrough. Or for example, the bracket 108 can be formed by injection molding plastic.

A wide range of suitable materials can be used for the bracket 108, including metals, plastics, etc. In a preferred embodiment, the bracket 108 is formed from aluminum, although other suitable materials can be used.

Figure 10:
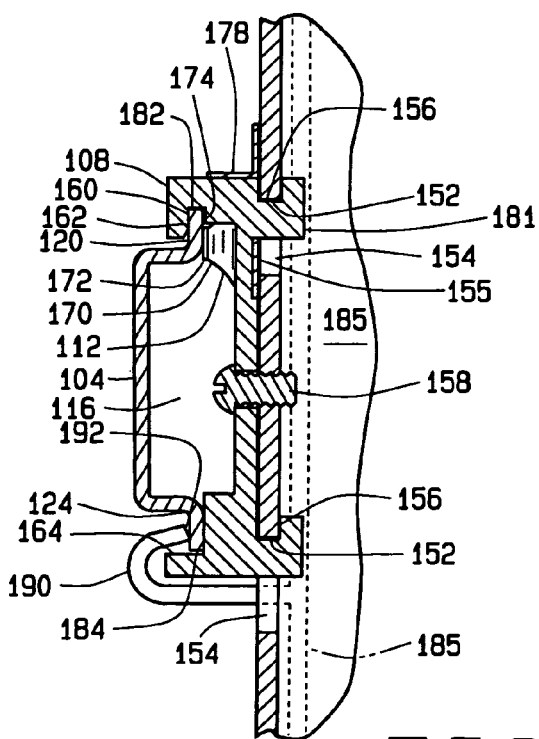
FIG. 10 is a partial vertical cross-sectional side view taken along the plane 10—10 in FIG. 3.
Figure 11:
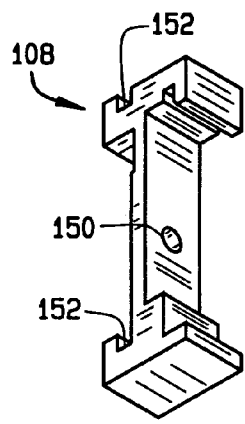
FIG. 11 is a perspective view of a bracket according to a preferred embodiment of the invention.

As shown in FIG. 10, the bracket 108 defines grooves 152. The bracket 108 can be coupled to the housing 100 by inserting the bracket 108 into appropriate apertures 154 formed in the housing 100 such that a corresponding edge 156 of the housing 100 enters each respective groove 152 in the bracket 108. After the bracket 108 has been coupled to the housing 100 in this manner, a fastener 158 can then be inserted through hole 150 to further secure the bracket 108 to the housing 100.

The bracket 108 further defines a groove or recess 160 formed in the portion that is directed to the rail 104. The recess 160 includes a flank or lip 162. The lip 162 is at least partially sloped or canted which allows the bracket 108 to be hooked onto the upper rail edge 182 in an at least somewhat pivotable manner, as shown in FIGS. 29A and 29B.

After the lip 162 of bracket 108 is hooked over the upper rail edge 182, the bracket 108 can then be subsequently pivoted to position the opposite end 164 of the bracket 108 adjacent the lower rail edge 184, as shown in FIGS. 29C and 29D. This pivotal movement causes the wings 170 of the clamp 112 to resiliently engage the face 174 of the rail 104, proximal to the engagement between the lip 162 and the back surface 120 of the rail 104.

In a preferred embodiment, the clamp 112 comprises means for resiliently engaging the surface 174 of the rail 104, proximal to the engagement between the rail 104 and the lip 162. Alternatively, other means for resiliently engaging the surface 174 of the rail 104 can also be employed, such as coil springs, etc.

Figure 23:
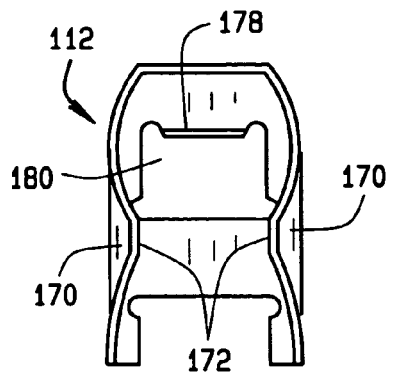
FIG. 23 is front elevation view of a clamp according to a preferred embodiment of the invention.
Figure 24:
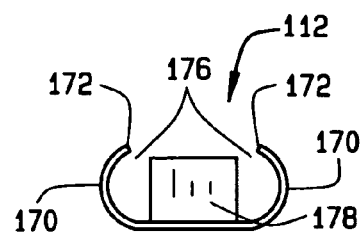
FIG. 24 is a top plan view of the clamp shown in FIG. 23.
Figure 25:
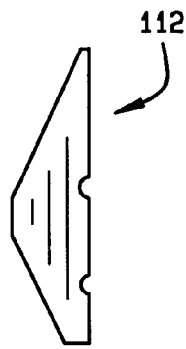
FIG. 25 is a right side elevation view of the clamp shown in FIG. 23.
Figure 33:
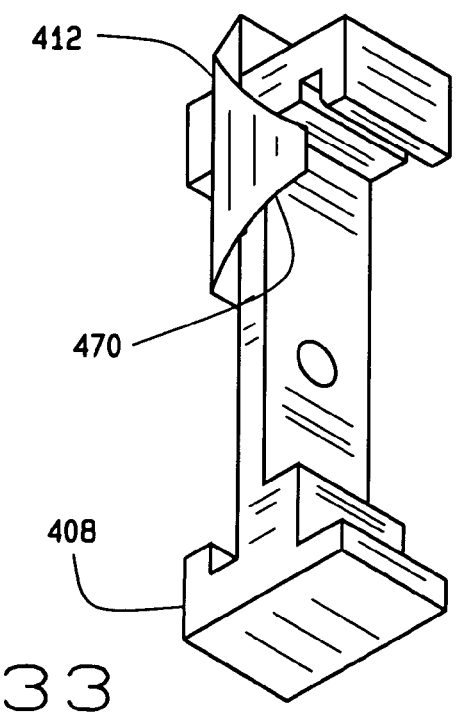
FIG. 33 is a perspective view of a bracket and clamp according to another preferred embodiment of the invention.

As shown in FIGS. 23 through 25, the clamp 112 includes a pair of generally opposed wings or prongs 170. Alternatively, other embodiments can include a clamp having any suitable number of resilient wings. For example, FIG. 33 illustrates a bracket 408 engaged with a clamp 412 wherein the clamp 412 includes only one resilient wing 470.

As shown in FIG. 10, the clamp 112 includes a substantially flat central section 155 disposed between the bracket 108 and the housing 100. As shown in FIG. 24, the clamp 112 has a generally C-shaped cross-section within the wings 170 define a C-shaped channel therebetween, although other suitable cross-sectional shapes can be employed.

In one embodiment, each wing 170 includes an inner radius of curvature of about 0.126 inches. Alternatively, the clamp and its wings can be variously sized depending at least in part on the particular application in which the clamp is to be used.

Figure 21:
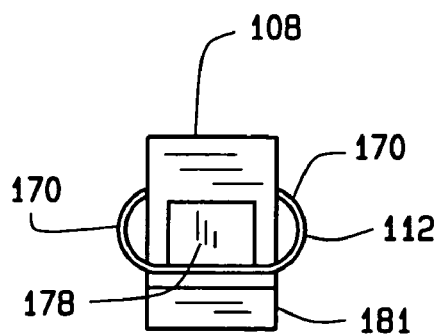
FIG. 21 is a top plan view of the bracket and clamp shown in FIG. 16.
Figure 22:
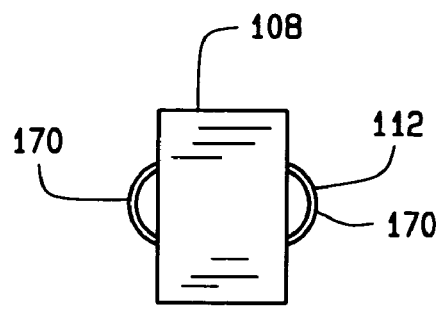
FIG. 22 is a bottom plan view of the bracket and clamp shown in FIG. 16.

As shown in FIGS. 21, 23 and 24, the clamp 112 can also include an outwardly extending portion or guide 178 adjacent an opening 180. The guide 178 can be used for guiding the bracket portion 181 into the opening 180.

At an appropriate point during the mounting movement of the bracket 108 to the rail 104 (FIGS. 10 and 29), the wings 170 of clamp 112 will come into contact with an appropriate portion 174 of the rail 104. This contact with the rail surface 174 causes the wings 170 to flex, deflect and/or deform. While the bracket 108 is detachably mounted to the rail 104, the clamp 112 can continuously apply a clamping force between the bracket 108 and the rail 104. This clamping force provides sufficient friction in order to at least inhibit the bracket 108 from slidably moving along the rail 104.

Using the clamp 112 in conjunction with the bracket 108 is particularly advantageous with regard to different types of rails. Although standardized DIN rails are typically used for mounting electrical components, such is not always the case. Instead, non-standard rail types are becoming more widespread in use. Such rails can differ with regard to the thickness of the material used to form the rail, the width of the side edges or flanges, among other features. However, the clamp's 112 resilient engagement with the rail, and clamping force created thereby, can accommodate for varying dimensions and structures of different types of rails, and thus prevent, or at least inhibit, sliding of the bracket along a rail even when the rail is not a standardized DIN rail.

Figure 2:
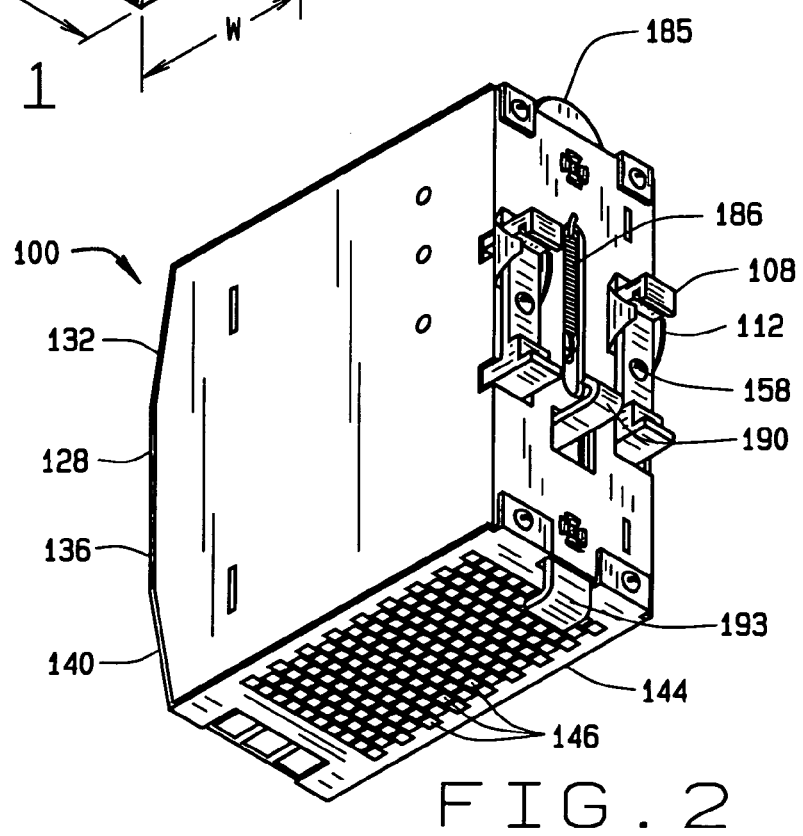
FIG. 2 is a rear perspective view of the housing shown in FIG. 1.
Figure 7:
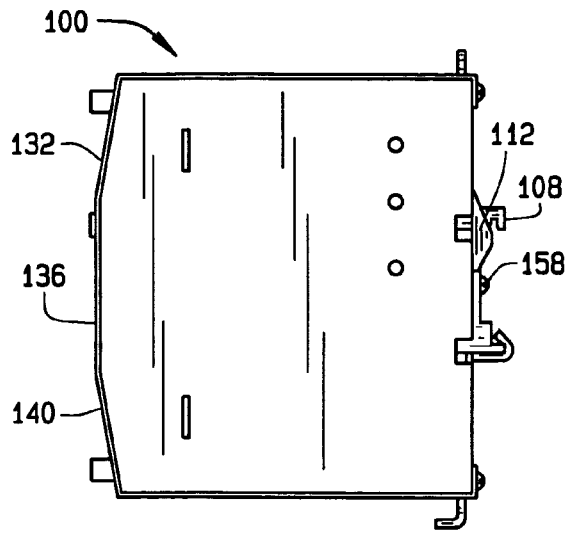
FIG. 7 is a right side elevation view of the housing shown in FIG. 1.
Figure 8:
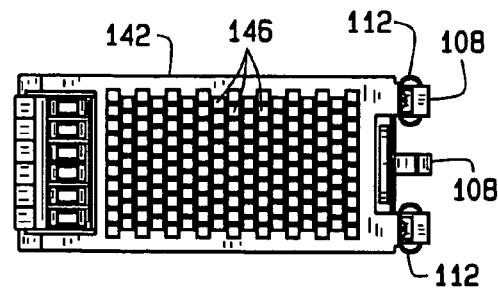
FIG. 8 is a top plan view of the housing shown in FIG. 1.
Figure 26:
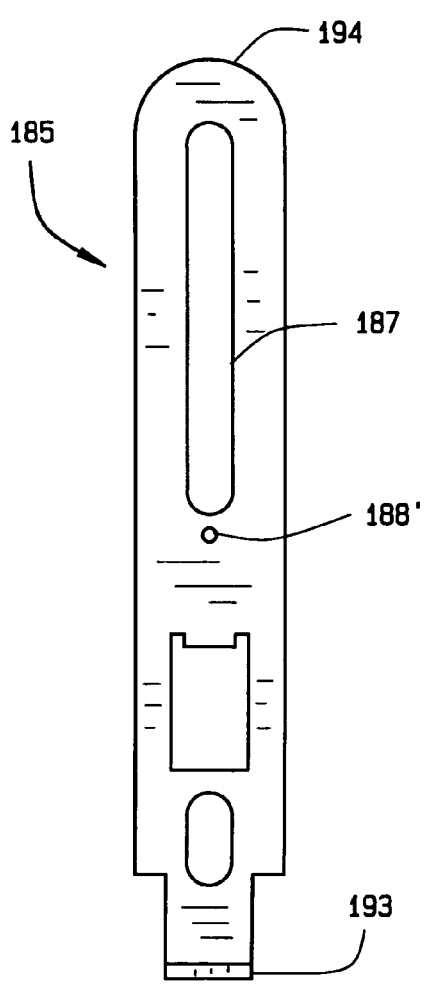
FIG. 26 is a front elevation view of a latch according to a preferred embodiment of the invention.
Figure 27:
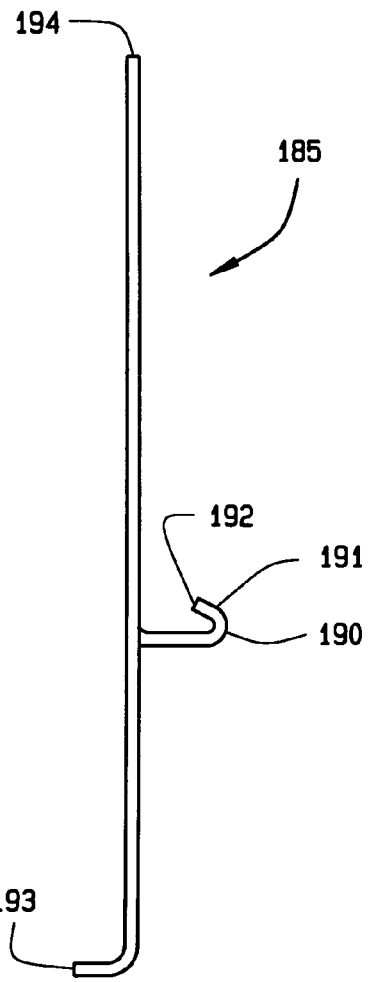
FIG. 27 is a left side elevation view of the latch shown in FIG. 26.
Figure 28:
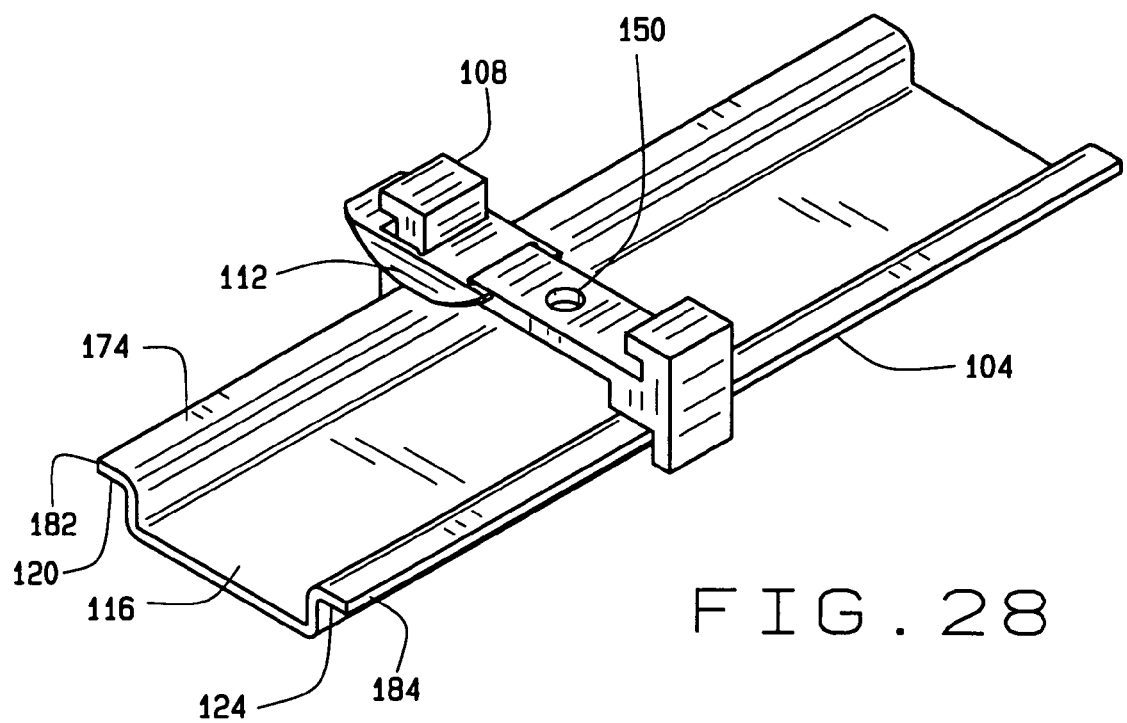
FIG. 28 is a perspective view of a bracket and clamp shown in FIG. 16 shown while detachably mounted to a rail.

FIGS. 26 and 27 illustrated a locking member or latch 185 according to one embodiment of the invention. The latch 185 is adapted to engage the back face 124 of the rail 104 adjacent the lower rail edge 184 against the bias of the clamp 112. The latch 185 is movably coupled to the housing 100 to slidably engage the back face 124 adjacent the lower rail edge 184 (FIGS. 3, 10 and 29D) in a first direction and to slidably disengage the rail 104 in a second direction. As shown in FIG. 2, a substantial portion of the locking member 185 is internal to the housing 100, although such is not required. Alternatively, other embodiments can include a latch or locking member which is entirely, or at least substantially, external to the housing.

The locking member 185 is preferably biased into the locking position, i.e., the position in which the locking member 185 is engaged with the back surface 124 of the rail 104 (FIGS. 3, 10 and 29). In the illustrated embodiment, the locking member 185 is biased in its locking position with a coil spring 186 (FIGS. 2 and 5), although other biasing devices can also be employed.

The coil spring 186 extends at least partially into an opening 187 (FIGS. 5 and 26) formed in the locking member 185. The opposed ends 188', 188" of the coil spring 186 are attached to respective openings 189', 189" defined by the locking member 185 and housing 100.

As shown in FIGS. 3 and 27, the locking member 185 includes a hook arm 190 having a canted or sloped portion 191. When the housing 100 is pivotably moved towards the rail 104, the rail 104 is brought into contact with the canted portion 191 (FIG. 29C). A force of sufficient magnitude must then be applied to overcome the biasing force applied by the coil spring 186. Once the spring biasing force is overcome, the locking member 185 will move out of its locking position and allow continued pivotal movement of the housing 100 relative to the rail 104. Ultimately, the rail 104 will pass beyond the end portion 192 of the hook arm 190. At which time, the spring biasing force applied by the coil spring 186 will cause the locking member 185 to return to its locking position.

When the locking member 185 is in its locking position (shown in FIGS. 3, 10 and 29C), the end portion 192 of hook arm 190 contacts and retains the back surface 124 adjacent the lower rail edge 184. Accordingly, unintentional detachment or loosening of the housing 100 from the rail 104 is resisted by the positioning of the upper rail edge 182 within the upper bracket groove 160 and by the hook arm 190 contacting and retaining the back surface 124 of the rail 104 adjacent the lower rail edge 184.

In order to detach the housing 100 from the rail 104, the locking member 185 is moved downwardly so as to disengage the hook arm 190 from the rail 104. In the illustrated embodiment of FIG. 4, the locking member 185 includes a hooked portion 193 extending below the lower surface 144 of the housing 100, and a rounded portion 194 extending above the upper surface 142. The hooked portion 193 and/or rounded portion 194 can be accessed by a user, for example, with a finger and/or a tool (e.g., screw driver, etc.). Accordingly, a user can move the locking member 185 downwardly to disengage the hook arm 190 from the back rail surface 124 adjacent the lower rail edge 184 by sufficiently pressing downward (e.g., with the user's finger, with a tool, etc.) on either or both the hooked portion 193 and/or rounded portion 194.

Disengagement of the hook arm 190 from the rail 104 allows the lower portion of the housing 100 to be pivoted or swung away from the rail 104. Subsequently, the housing 100 can be removed from the rail 104 by disengaging the lip 162 from the upper rail edge 182 through a detachment movement, which in the illustrated embodiment of FIG. 29 is generally clockwise.

In a preferred embodiment, the locking member 185 comprises the means for engaging the back face 124 of the rail 104 adjacent the lower edge 184 against the bias of the clamp 112. Alternatively, other means for engaging the back face 124 of the rail 104 adjacent the lower edge 184 against the bias of the clamp 112 can be employed, such as a flexible hook formed on the bracket 108 itself, etc.

It should also be noted that the locking member 185 can be formed or manufactured from various materials (e.g., metals, plastics, etc.). The locking member 185 can also be configured differently than what is shown in the drawings. In particular, the locking member 185 does not necessarily have to be slidably movable in the vertical direction. Rather, the locking member could be formed of various types of snapping means that are suitable for passing over the lower rail edge 184 while retaining the rail 104 during mounting of the housing 100.

The bracket and clamp do not necessarily have to be separate components as shown in FIGS. 11 through 25. Instead, the bracket and clamp can have a monolithic construction in which the bracket and clamp are integrally formed as a single component (e.g., machined as a single metallic piece, injection molded as a single plastic piece, etc.).

FIGS. 29A through 29D generally illustrate an exemplary manner in which the housing 100 can be detachably mounted to the rail 104. The housing 100 is first tilted slightly backwards (represented by arrow 195 in FIG. 29A). The housing 100 is then moved towards the rail 104 (as represented by arrow 196 in FIG. 29B). Next, the housing 100 is pushed downward (as represented by arrow 197 in FIG. 29C) so as to position the upper rail edge 182 within the recess 160 of the bracket 108, which, in turn, engages the lip 162 with the back surface 120 of the rail 104 adjacent the upper rail edge 182. The lower front edge of the housing 100 is then pushed (as represented by arrow 198 in FIG. 29D) towards the rail 104 with sufficient force to overcome the spring biasing force applied to the locking member 185 by coil spring 186. The locking member 185 will move out of its locking position and allow continued pivotal movement of the housing 100 relative to the rail 104. As the bracket 108 is moved towards the rail 104, the bracket shoulder 164 passes over the lower rail edge 184. Ultimately, the rail 104 will pass beyond the end portion 192 of the hook arm 190. The spring biasing force applied by the coil spring 186 will then cause the locking member 185 to return to its locking position in which the hook arm 190 engages the back surface 124 of the rail 104 adjacent the lower rail edge 184, against the bias of the clamp 112. The housing 100 can then be shook slightly to determine that the locking member 185 is in its locking position.

To detach the housing 100 from the rail 104, the locking member 185 is moved downwardly so as to disengage the hook arm 190 from the rail 104. For example, a user can move the locking member 185 downwardly to disengage the hook arm 190 from the back rail surface 124 adjacent the lower rail edge 184 by sufficiently pressing downward on either or both the hooked portion 193 and/or rounded portion 194.

Disengagement of the hook arm 190 from the rail 104 allows the lower portion of the housing 100 to be pivoted or swung away from the rail 104. Subsequently, the housing 100 can be removed from the rail 104 by disengaging the lip 162 from the upper rail edge 182 through a detachment movement, which in the illustrated embodiment of FIG. 29 is generally clockwise.

Accordingly, various embodiments of the present invention enable devices and/or housings to be relatively easily and quickly installed onto or removed from rails without tools thus allowing for significant installation and service time reductions.

The invention is applicable to a wide range of rail types and sizes. Accordingly, the specific references to DIN rail herein should not be construed as limiting the scope of the present invention to use with only DIN rails or to only one specific form/type of rail.

The invention is also applicable to a wide range of housings in various sizes, shapes and types. Accordingly, the specific references to housing herein should not be construed as limiting the scope of the present invention to only one specific form/type of housing.

When introducing elements or features of the present invention and the exemplary embodiments, the articles "a", "an", "the" and "said" are intended to mean that there are one or more of such elements or features. The terms "comprising", "comprise", "including", "include", "having", and "have" are intended to be inclusive and mean that there may be additional elements or features other than those specifically noted.

It should be noted that certain terminology is used herein for the purpose of reference only, and thus are not intended to be limiting. For example, terms such as "upper", "lower", "above", and "below" refer to directions in the drawings to which reference is made. Terms such as "front", "back", "rear", and "side", describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second" and other such numerical terms referring to structures do not imply a sequence or order unless clearly indicated by the context.

The description of the invention is merely exemplary in nature and is in no way intended to limit the invention, its application, or uses. Thus, variations that do not depart from the substance of the invention are intended to be within the scope of the invention. Such variations are not to be regarded as a departure from the spirit and scope of the invention.

What is claimed:

1. An apparatus for detachably mounting a device to a rail having generally oppositely facing first and second edges, each edae having adjacent front and back faces, the apparatus comprising:
   a bracket on the device, the bracket having a recess for receiving the first edge of the rail, the recess including a lip for engaging the back face of the rail adjacent the first edge;
   a clamp on the device, the clamp having a resilient wing for resiliently engaging the front face of the rail, proximal to the engagement between the rail and the lip;
   a latch for engaging the back face of the rail adjacent the second edge against the bias of the clamp;
   wherein the clamp has an opening therethrough for receiving a portion of the bracket, and wherein the clamp is coupled to the device such that a portion of the clamp is generally between the device and the bracket and such that a portion of the bracket is received through the opening of the clamp.

2. The apparatus according to claim 1, wherein the clamp comprises two wings disposed on opposite sides of the bracket.

3. The apparatus according to claim 1, wherein the clamp has a generally C-shaped cross-section, with a substantially flat central section disposed between the bracket and the device.

4. The apparatus according to claim 1, wherein the latch is movably coupled to the device to slidably engage the back face of the rail adjacent the second edge in a first direction and to slidably disengage the rail in a second direction.

5. An electrical power supply having coupled thereto the apparatus according to claim 1 for detachably mounting the electrical power supply to a rail.

6. The apparatus of claim 1, wherein when the apparatus is detachably mounting the device to the rail:
   the lip substantially contacts the back face of the first edge;
   the resilient wing substantially contacts the front face of the first edge; and
   the latch substantially contacts the back face of the second edge.

7. The apparatus according to claim 1, wherein the clamp is configured such that the clamp and the resilient wing cooperate to apply a clamping force between the bracket and the rail having sufficient friction for inhibiting sliding movement of the bracket along the rail.

8. The apparatus according to claim 1, wherein the clamp includes a portion disposed between portions of the device and the bracket.

9. The apparatus of claim 8, wherein the wing includes a generally concave curvature, relative to the bracket, curving generally from the clamp portion disposed generally between the portions of the device and the bracket towards the lip.

10. The apparatus according to claim 1, wherein the lip includes at least one partially sloped portion configured to facilitate engagement of the rail's first edge of the rail within the recess.

11. The apparatus according to claim 1, wherein the clamp includes a guide adjacent the opening for guiding the bracket portion into the opening.

12. In combination with a rail having generally oppositely facing first and second edges, each edge having adjacent front and back faces, a device detachably mounted to the rail, the device comprising:
   a bracket having a recess for receiving the first edae of the rail, the recess including a lip for engaging the back face of the rail adjacent the first edge;
   a clamp having a resilient wing for resiliently engaging the front face of the rail, proximal to the engagement between the rail and the lip;
   a latch for engaging the back face of the rail adjacent the second edge against the bias of the clamp;
   wherein the clamp has an opening therethrough for receiving a portion of the bracket, and wherein the clamp is coupled to the device such that a portion of the clamp is generally between the device and the bracket and such that a portion of the bracket is received through the opening of the clamp.

13. The combination according to claim 12, wherein the clamp comprises two resilient wings disposed on opposite sides of the bracket.

14. The combination according to claim 12, wherein the clamp has a generally C-shaped cross-section, with a substantially flat central section disposed between the bracket and the device.

15. The combination according to claim 12, wherein the latch is movably coupled to the device to slidably engage the back face of the rail adjacent the second edge in a first direction and to slidably disengage the rail in a second direction.

16. A housing detachably mountable to a rail having generally oppositely facing first and second edges, each edge having adjacent front and back faces, the housing comprising:
   a bracket defining a recess for receiving the first edae of the rail, the recess including a lip for engaging the back face of the rail adjacent the first edge;
   a clamp including a resilient wing for resiliently engaging the front face of the rail, proximal to the engagement between the rail and the lip;
   a latch for engaging the back face of the rail adjacent the second edge against the bias of the clamp;
   wherein the clamp has an opening therethrough for receiving a portion of the bracket, and wherein the clamp is coupled to the housing such that a portion of the clamp is generally between the housing and the bracket and such that a portion of the bracket is received through the opening of the clamp.

17. The housing according to claim 16, wherein the clamp comprises two wings disposed on opposite sides of the bracket.

18. The housing according to claim 16, wherein the clamp has a generally C-shaped cross-section, with a substantially flat central section disposed between the bracket and the housing.

19. The housing according to claim 16, wherein the housing defines a plurality of generally rectangular openings for venting an area between the housing and a component positioned within the housing.

20. The housing according to claim 19, wherein the openings are arranged in a plurality of rows, each row being generally perpendicular to a front surface of the housing.

21. The housing according to claim 16, wherein the housing includes a beveled front surface.

22. The housing according to claim 16, wherein the latch is movably coupled to the housing to slidably engage the back face of the rail adjacent the second edge in a first direction and to slidably disengage the rail in a second direction.

23. The housing according to claim 16, further comprising an electrical power supply housed within the housing.

24. An apparatus for detachably mounting a device to a rail having generally oppositely facing first and second edges, each edge having adjacent front and back faces, the apparatus comprising:

means, coupled to the device, for defining a recess for receiving the first edge of the rail, the recess including a lip for engaging the back face of the rail adjacent the first edge;

means for resiliently engaging the front face of the rail, proximal to the engagement between the rail and the lip, said means for resiliently engaging including an opening therethrough, said means for resiliently engaging being coupled to the device such that a portion of the means for resiliently engaging is generally between the device and said means for defining a recess, and such that a portion of the means for defining a recess is received through the opening; and means for engaging the back face of the rail adjacent the second edge against the bias of the means for resiliently engaging.

25. A method for detachably mounting a device to a rail having generally oppositely facing first and second edges, each edge having adjacent front and back faces, the method comprising:

positioning the first edae of the rail within a recess defined by a bracket on the device, the positioning engaging a lip of the recess with the back face of the rail adjacent the first edge and resiliently engaging a wing of a clamp on the device with the front face of the rail, proximal to the engagement between the rail and the lip;

engaging a latch with the back face of the rail adjacent the second edge against the bias of the clamp;

wherein the method includes coupling the clamp to the device by positioning a portion of the clamp between the device and the bracket; and wherein the clamp has an opening therethrough, and wherein the coupling includes receiving a portion of the bracket through the opening of the clamp.

26. The method according to claim 25, wherein the clamp has a generally C-shaped cross-section with a substantially flat central section, and wherein the coupling includes positioning the substantially flat central section between the bracket and the device.

\* \* \* \* \*

UNITED STATES PATENT AND TRADEMARK OFFICE
CERTIFICATE OF CORRECTION

PATENT NO. : 7,073,971 B2
APPLICATION NO. : 10/775727
DATED : July 11, 2006
INVENTOR(S) : Larry Edward Schurr et al.

It is certified that error appears in the above-identified patent and that said Letters Patent is hereby corrected as shown below:

CLAIM 1

Column 9, line 24: replace "edae" with --edge--

CLAIM 12

Column 10, line 22: replace "edae" with --edge--

CLAIM 16

Column 10, line 53: replace "edae" with --edge--

CLAIM 25

Column 12, line 14: replace "edae" with --edge--

Signed and Sealed this

Twenty-sixth Day of September, 2006

JON W. DUDAS
*Director of the United States Patent and Trademark Office*